(12) United States Patent
Steiert et al.

(10) Patent No.: US 10,793,429 B2
(45) Date of Patent: Oct. 6, 2020

(54) METHOD FOR PRODUCING PACKAGED MEMS ASSEMBLIES AT THE WAFER LEVEL, AND PACKAGED MEMS ASSEMBLY

(71) Applicant: Infineon Technologies AG, Neubiberg (DE)

(72) Inventors: Matthias Steiert, Ehrenkirchen (DE); Christian Geissler, Teugn (DE); Karolina Zogal, Regensburg (DE)

(73) Assignee: INFINEON TECHNOLOGIES AG, Neubiberg (DE)

( * ) Notice: Subject to any disclaimer, the term of this patent is extended or adjusted under 35 U.S.C. 154(b) by 0 days.

(21) Appl. No.: 16/748,087

(22) Filed: Jan. 21, 2020

(65) Prior Publication Data
US 2020/0156933 A1    May 21, 2020

Related U.S. Application Data

(62) Division of application No. 15/975,243, filed on May 9, 2018, now Pat. No. 10,584,028.

(30) Foreign Application Priority Data

May 10, 2017  (DE) .................. 10 2017 207 887

(51) Int. Cl.
*B81C 1/00* (2006.01)
*H01L 23/31* (2006.01)
*B32B 15/04* (2006.01)
*B81B 7/00* (2006.01)

(52) U.S. Cl.
CPC ........ *B81C 1/00333* (2013.01); *B32B 15/043* (2013.01); *B81B 7/0032* (2013.01); *B81C 1/00301* (2013.01); *H01L 23/315* (2013.01)

(58) Field of Classification Search
CPC .. B81C 1/00333; B32B 15/043; B81B 7/0032
See application file for complete search history.

(56) References Cited

U.S. PATENT DOCUMENTS

| | | | |
|---|---|---|---|
| 8,080,445 B1 * | 12/2011 | Pagaila | H01L 24/17 438/106 |
| 8,963,340 B2 | 2/2015 | Feger et al. | |
| 10,005,660 B1 * | 6/2018 | Essig | B81C 1/00238 |

(Continued)

*Primary Examiner* — Errol V Fernandes
(74) *Attorney, Agent, or Firm* — Slater Matsil, LLP

(57) ABSTRACT

A production method includes providing a semiconductor substrate with a wiring layer stack having cutouts on a first main surface region of the semiconductor substrate at which MEMS components are arranged in an exposed manner in the cutouts and projecting through contact elements are arranged at metallization regions of the wiring layer stack; applying a b-stage material layer cured in an intermediate stage on the wiring layer stack, such that the cutouts are covered by the b-stage material layer and the vertically projecting through contact elements are introduced into the b-stage material layer; curing the b-stage material layer to obtain a cured b-stage material layer; thinning the cured b-stage material layer; and applying a redistribution layer (RDL) structure on the thinned, cured b-stage material layer to obtain an electrical connection between the wiring layer stack and the RDL structure via the through contact elements.

20 Claims, 9 Drawing Sheets

(56) References Cited

U.S. PATENT DOCUMENTS

| | | |
|---|---|---|
| 10,453,785 B2 | 10/2019 | Shim et al. |
| 2012/0094418 A1 | 4/2012 | Grama et al. |
| 2012/0193778 A1 | 8/2012 | Mawatari |
| 2013/0237055 A1 | 9/2013 | Funaya et al. |
| 2014/0335658 A1 | 11/2014 | Scanlan et al. |
| 2015/0041993 A1 | 2/2015 | Palm |
| 2015/0115458 A1 | 4/2015 | Palm |

* cited by examiner

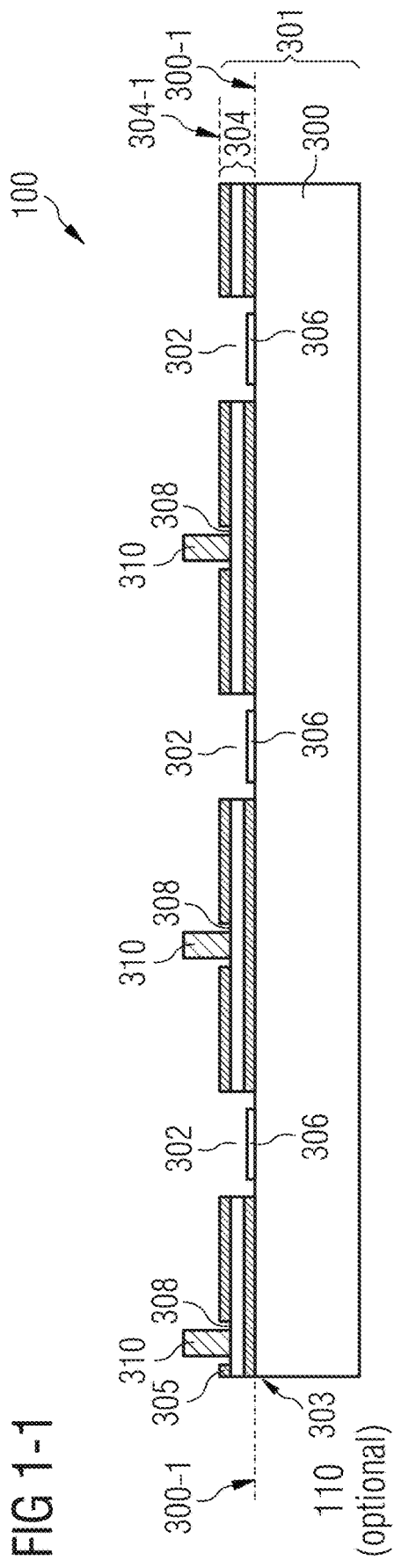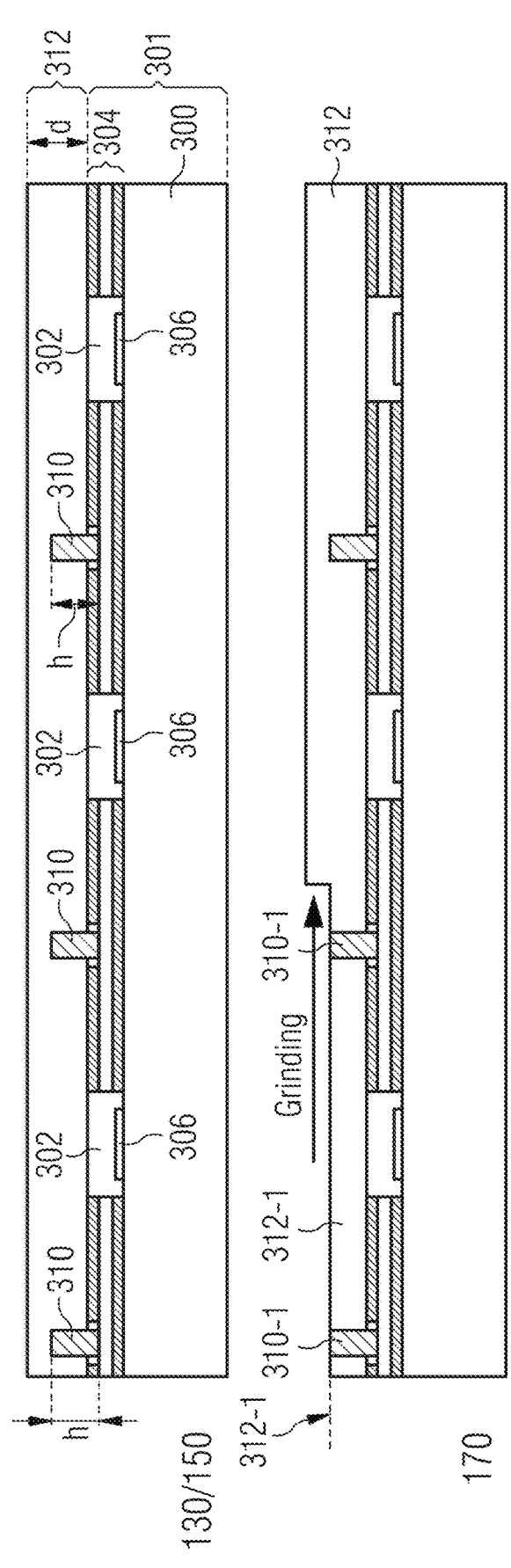

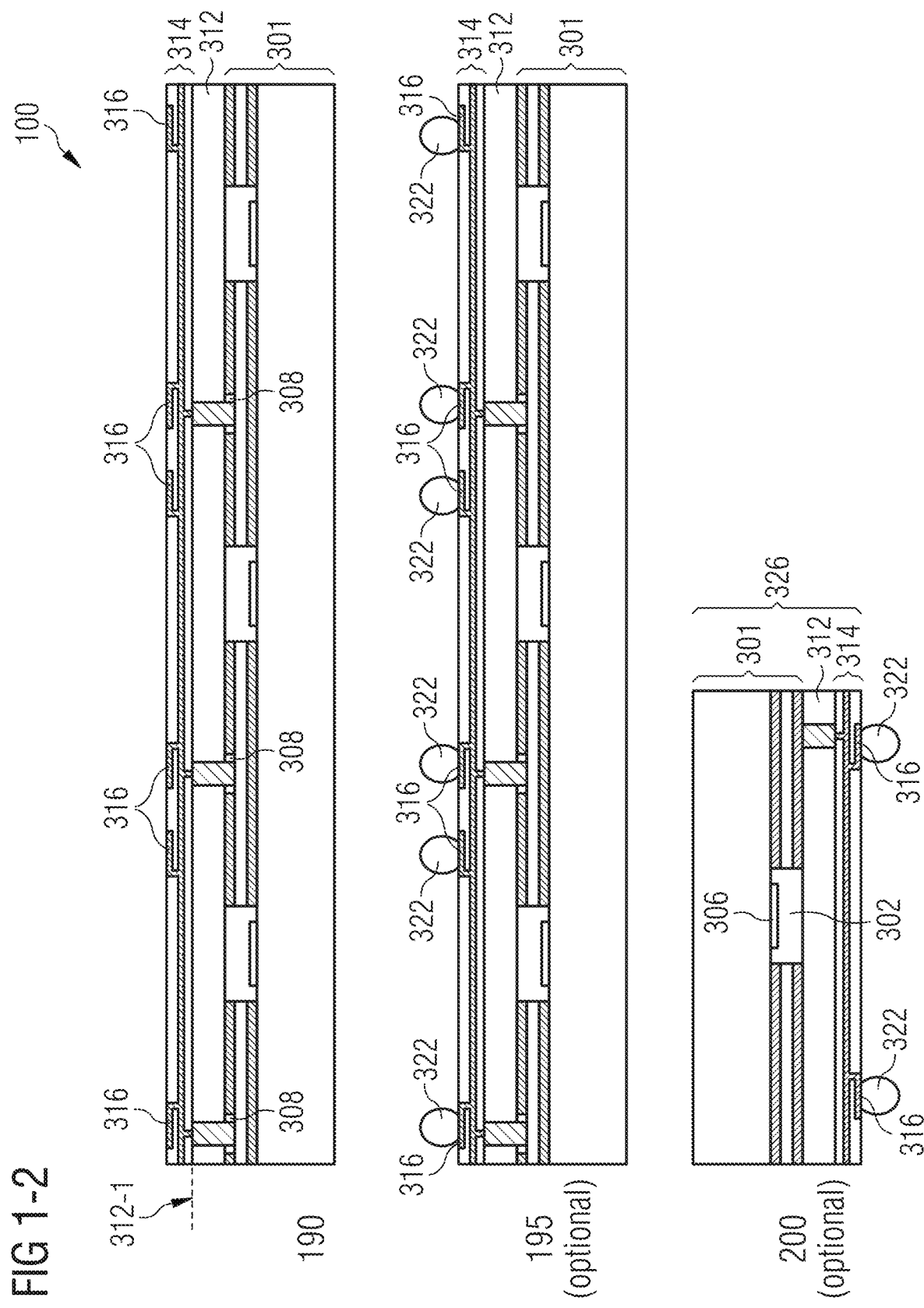

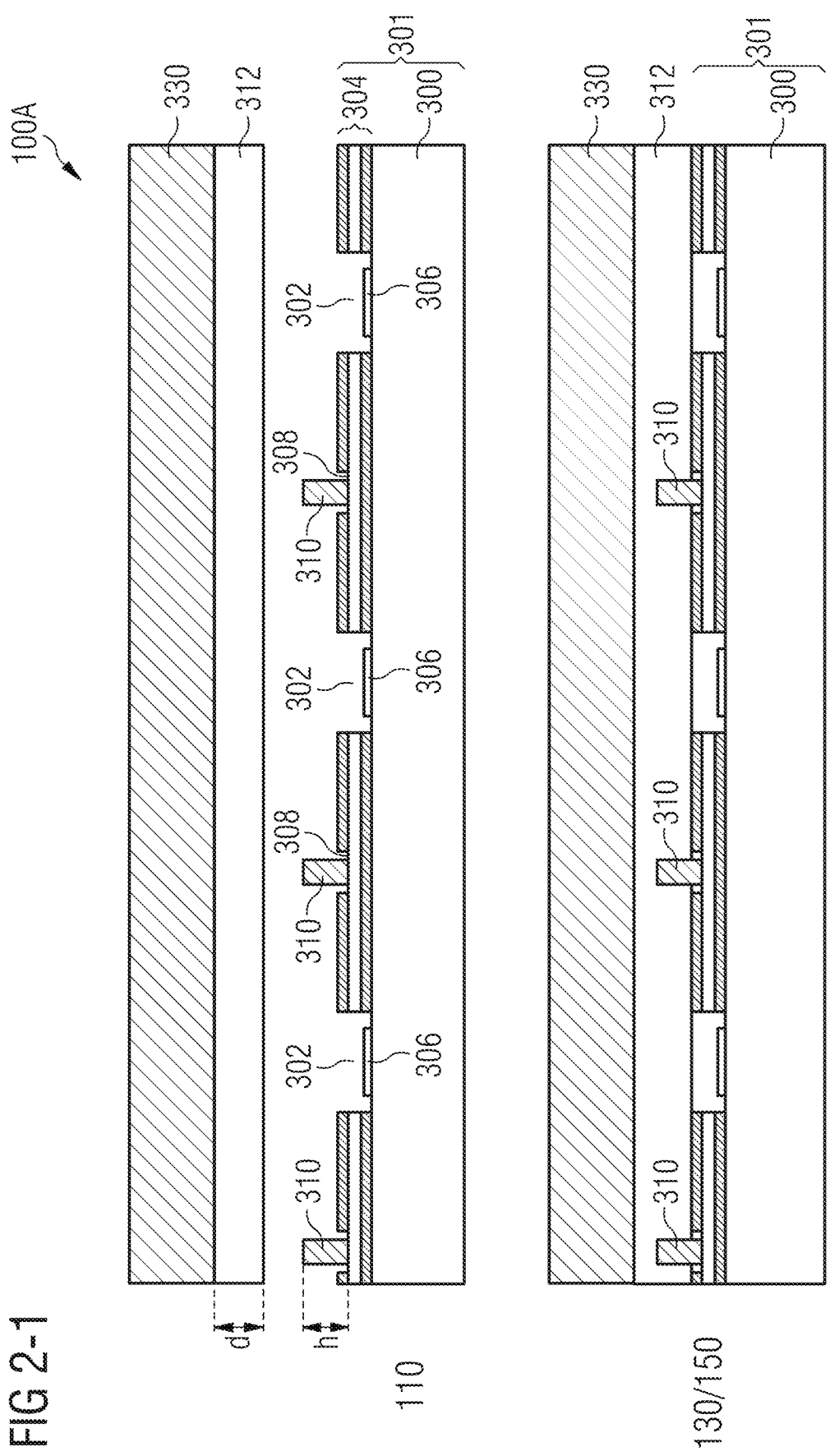

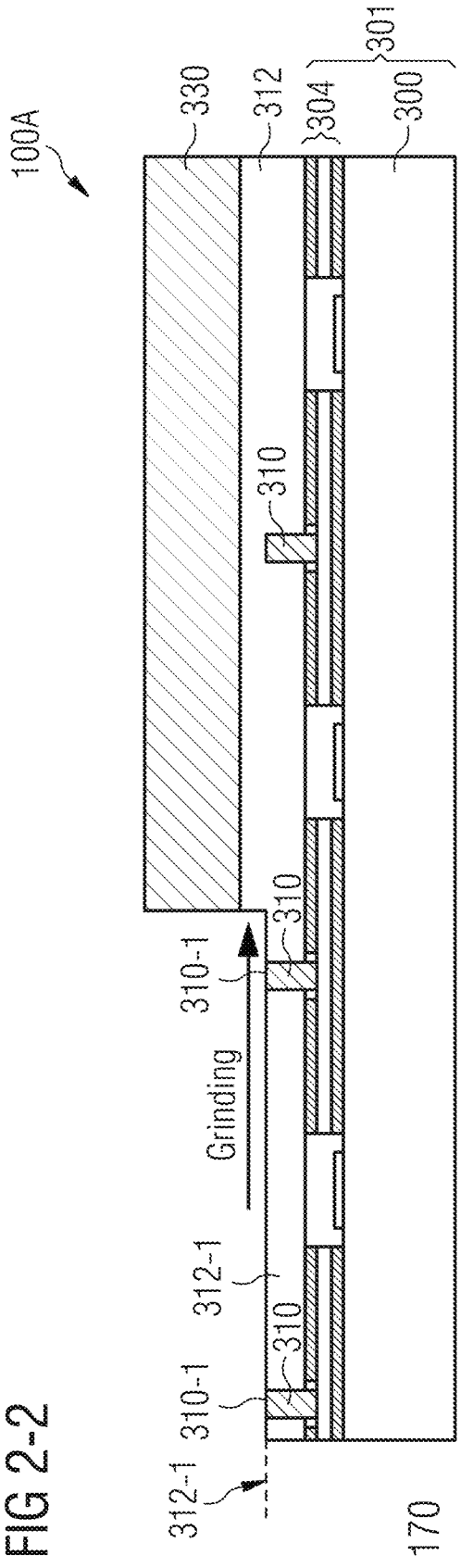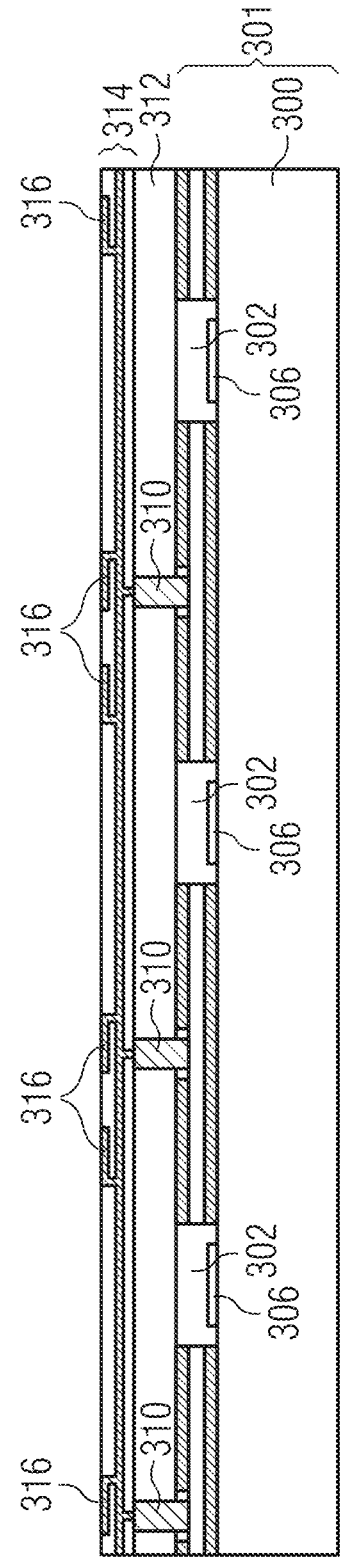

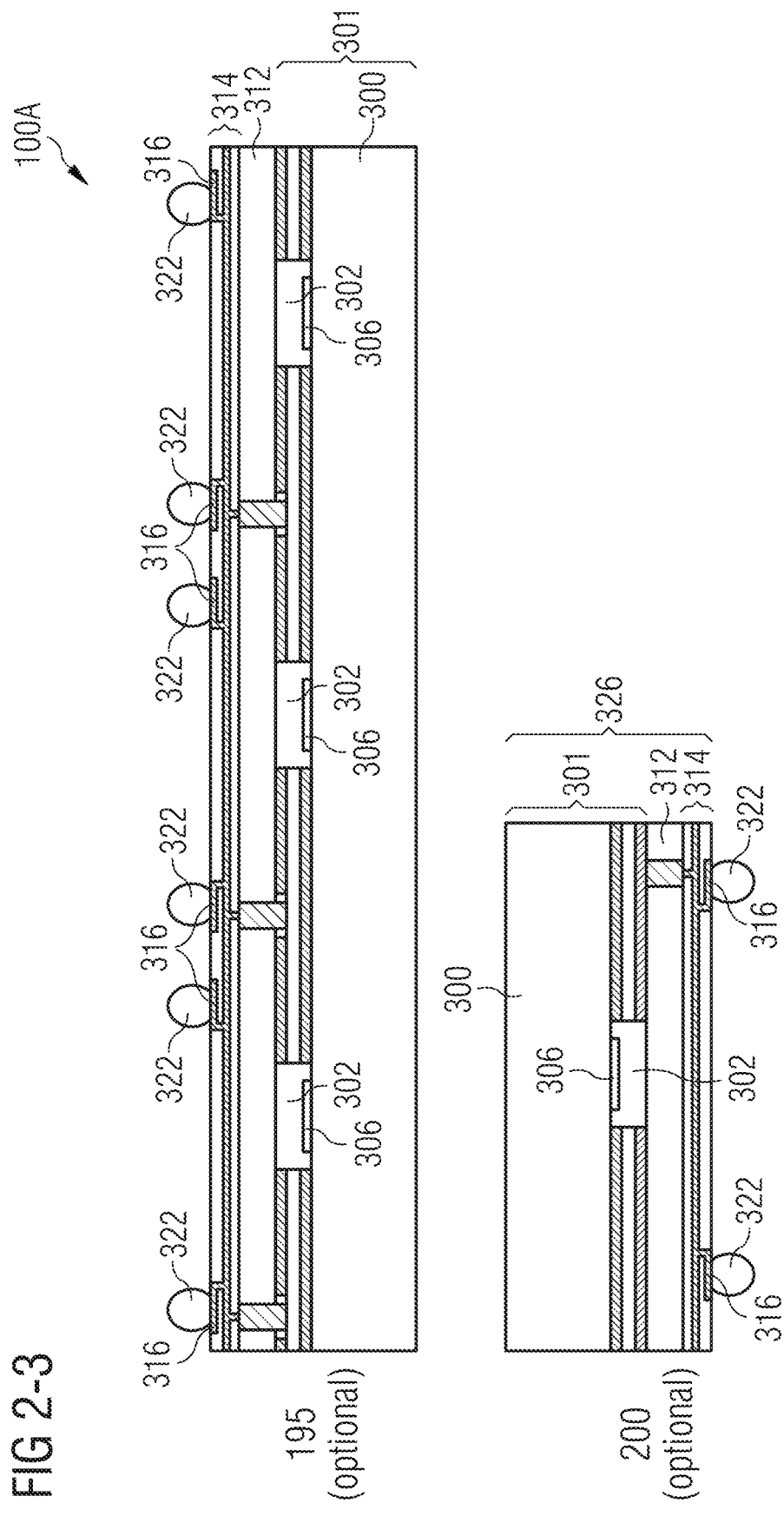

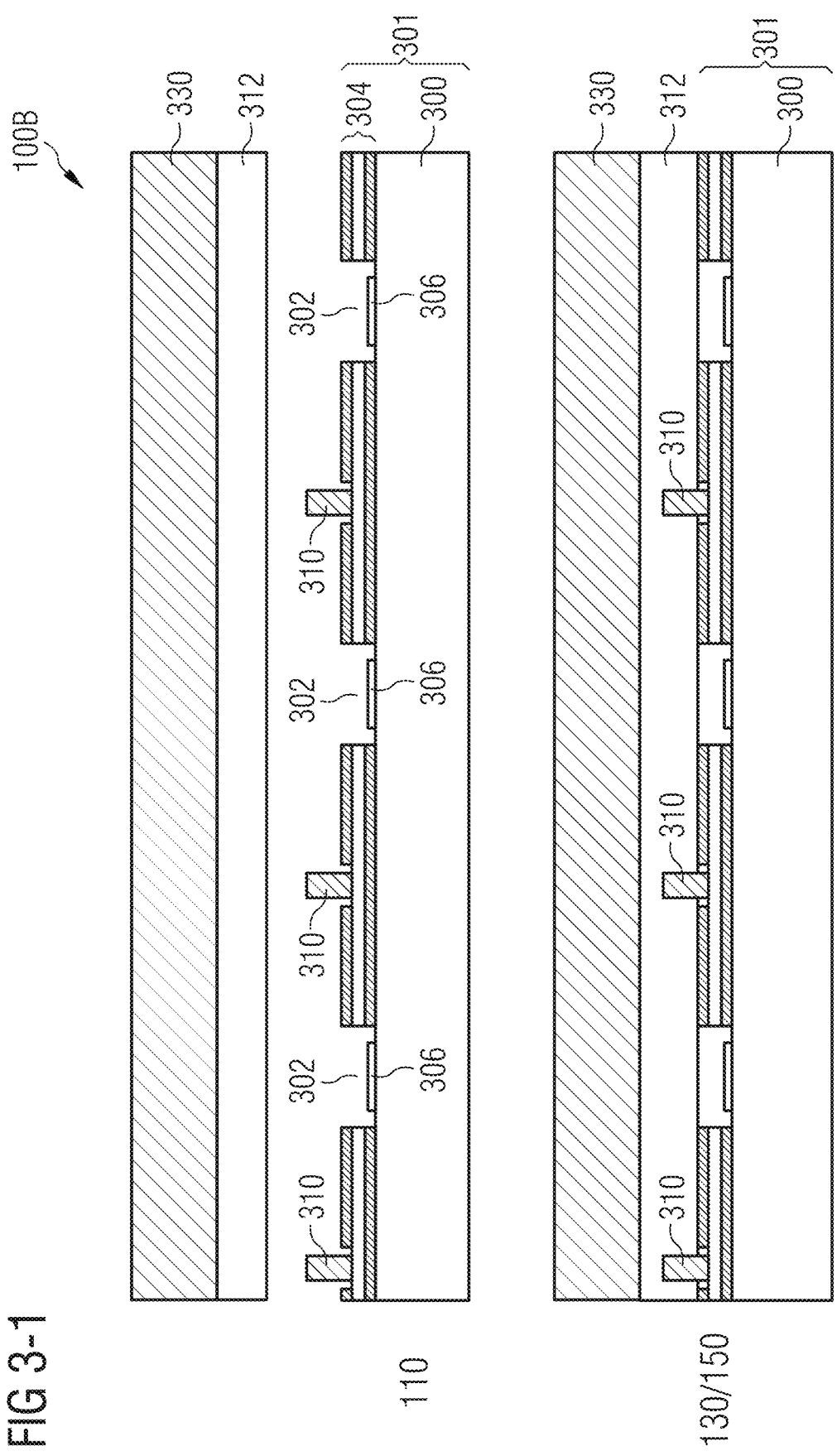

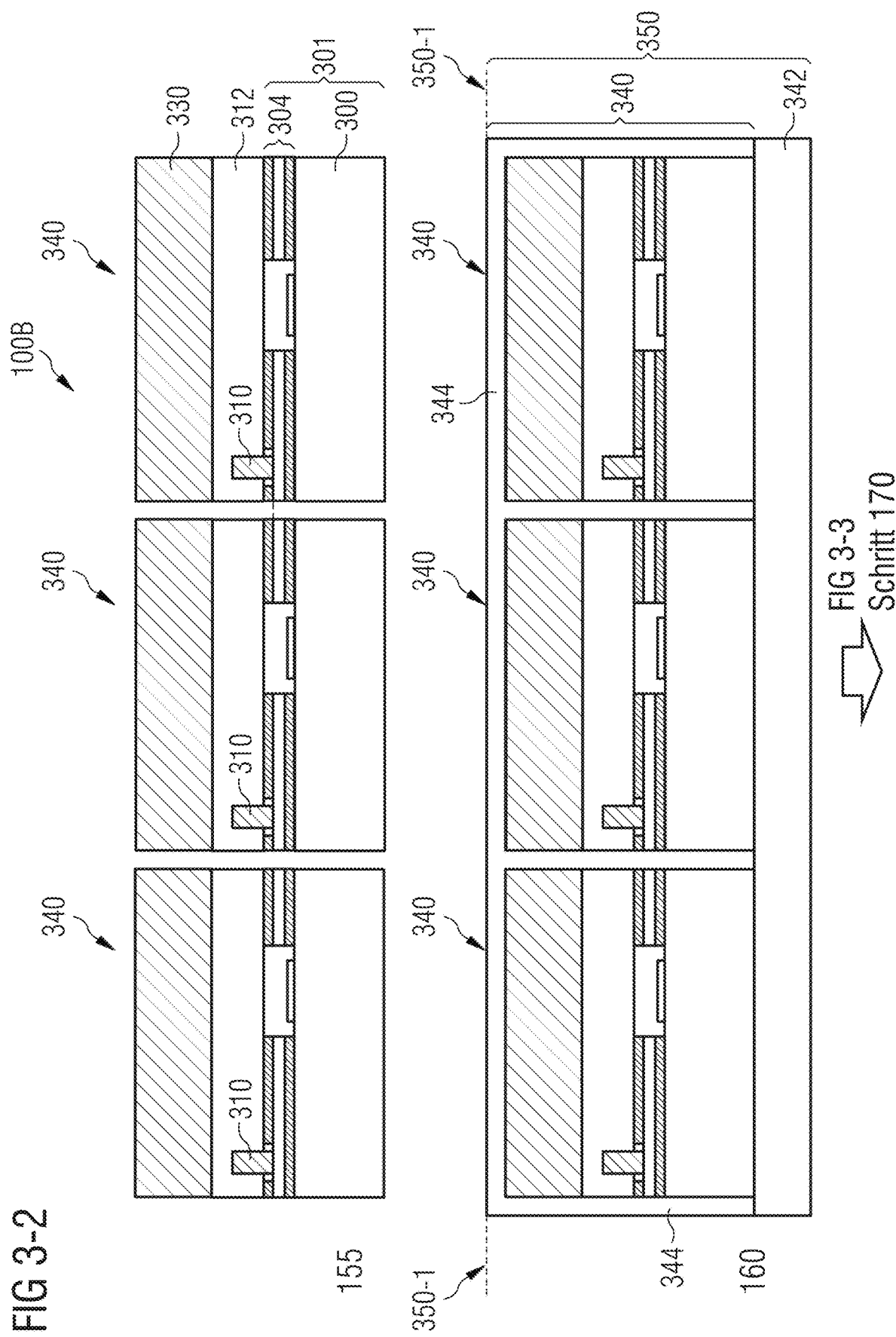

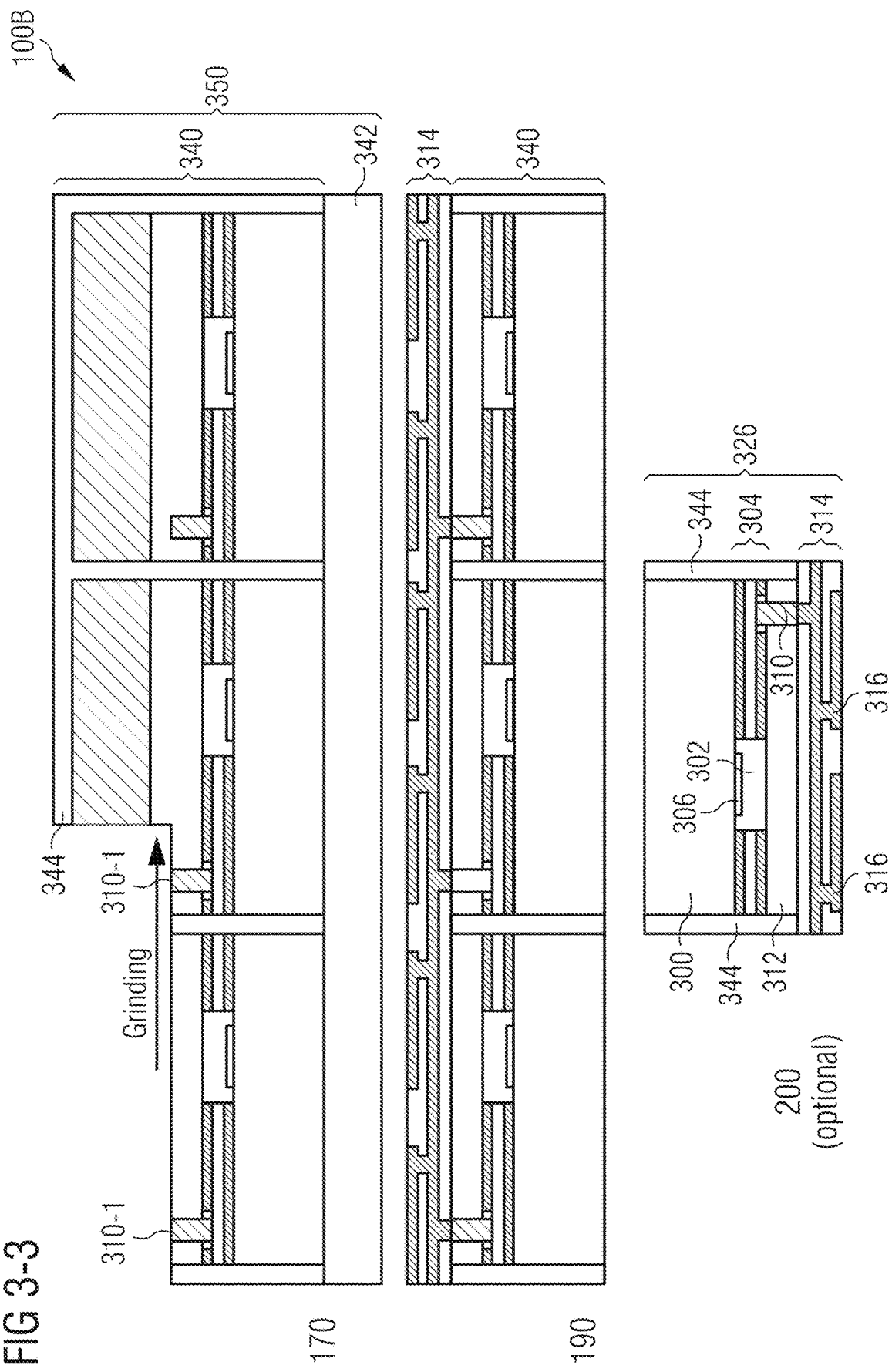

METHOD FOR PRODUCING PACKAGED MEMS ASSEMBLIES AT THE WAFER LEVEL, AND PACKAGED MEMS ASSEMBLY

This application is a divisional of U.S. patent application Ser. No. 15/975,243, filed May 9, 2018, which application claims the benefit of German Application No. 102017207887.1, filed on May 10, 2017, which applications are hereby incorporated herein by reference in their entirety.

TECHNICAL FIELD

The present disclosure relates in general to methods for producing packaged MEMS assemblies at the wafer level and to a packaged MEMS assembly.

BACKGROUND

In many applications of a semiconductor chip accommodated in a package, e.g. in flip-chip applications, TSV applications (TSV=Through Silicon Via), WLB packages (WLB=Wafer Level Ball Grid Array) or in specific packages, such as e.g. eWLB packages (eWLB=embedded Wafer Level Ball Grid Array), it is often necessary to carry out a redistribution of the basic connection structure of the chip connection pins. This is generally carried out using a so-called "RDL layer" (RDL=Redistribution Layer). An RDL layer is applied by definition at the wafer level on the semiconductor substrate, i.e. on the BeOL stack (Backend-of-Line stack) of the processed semiconductor wafer.

A redistribution layer is thus a specific layer plane within a package that connects the I/O pads (input/output pads) of an integrated circuit to the bond pads of the package, i.e. the I/O pads of an integrated circuit are made available at other locations or positions, thereby simplifying chip-to-chip bonding.

Consequently, there is a need for a method for producing packaged MEMS assemblies comprising an RDL layer at the wafer level and a need for a corresponding packaged MEMS assembly.

In particular, there is a need for a production process which is relatively simple to implement and by means of which applying an RDL structure on a semiconductor wafer at which sensitive MEMS structures, such as e.g. membranes of a pressure sensor or of a capacitive sound transducer, are arranged can be realized.

SUMMARY

Exemplary embodiments provide a production method (100; 100A; 100B) comprising the following steps: providing (110) a semiconductor substrate (300) with a wiring layer stack (304) having cutouts (302) on a first main surface region (300-1) of the semiconductor substrate (300), wherein at the first main surface region (300-1) of the semiconductor substrate (300) MEMS components (306) are arranged in an exposed manner in the cut-outs (302) of the wiring layer stack (304), and wherein projecting through contact elements (310) are arranged at metallization regions (308) of the wiring layer stack (304); applying (130) a b-stage material layer (312) cured in an intermediate stage on the wiring layer stack (304), such that the cutouts (302) in the wiring layer stack (304) are covered by the b-stage material layer (312) and the vertically projecting through contact elements (310) are furthermore introduced into the b-stage material layer (312); curing (150) the b-stage material layer (312) in order to obtain a cured b-stage material layer (312); thinning (170) the cured b-stage material layer (312) in order to expose end surface regions (310-1) of the through contact elements (310); and applying (190) an RDL structure (RDL=Redistribution Layer) on the thinned, cured b-stage material layer (312) in order to obtain an electrical connection between the wiring layer stack (304) and the RDL structure (314) via the through contact elements (310).

Exemplary embodiments furthermore provide a packaged MEMS assembly (400), comprising the following features: a semiconductor substrate (300) with a wiring layer stack (304) having a cutout (302) on a first main surface region (300-1) of the semiconductor substrate (300), wherein at the first main surface region (300-1) of the semiconductor substrate (300) a MEMS component (306) is arranged in an exposed manner in the cutout (302) of the wiring layer stack (304), and wherein vertically projecting through contact elements (310) are arranged at metallization regions (308) of the wiring layer stack (304); a cured b-stage material layer (312) on the wiring layer stack (304), wherein the cutout (302) in the wiring layer stack is closed by the cured b-stage material layer (312) and the vertically projecting through contact elements are furthermore introduced in the cured b-stage material layer (312) and extend through the cured b-stage material layer (312); and an RDL structure (RDL=Redistribution Layer) on the main surface region of the cured b-stage material layer (312), wherein end surface regions (310-1) of the vertically extending through contact elements (310) are connected to the RDL structure (314) at a main surface region (312-1) of the cured b-stage material layer (312) in order to provide an electrical connection between the wiring layer stack (304) and the RDL structure (314).

BRIEF DESCRIPTION OF THE DRAWINGS

Preferred exemplary embodiments of the present disclosure are explained in greater detail below with reference to the accompanying drawings, in which:

FIGS. 1-1 and 1-2 show a basic block diagram of the method for producing packaged MEMS assemblies at the wafer level in accordance with one exemplary embodiment;

FIGS. 2-1, 2-2 and 2-3 show a basic flow diagram of a method for producing packaged MEMS assemblies at the wafer level in accordance with a further exemplary embodiment;

FIGS. 3-1, 3-2 and 3-3 show a basic flow diagram of a method for producing packaged MEMS assemblies at the wafer level in accordance with a further exemplary embodiment.

DETAILED DESCRIPTION OF ILLUSTRATIVE EMBODIMENTS

Figure 4:
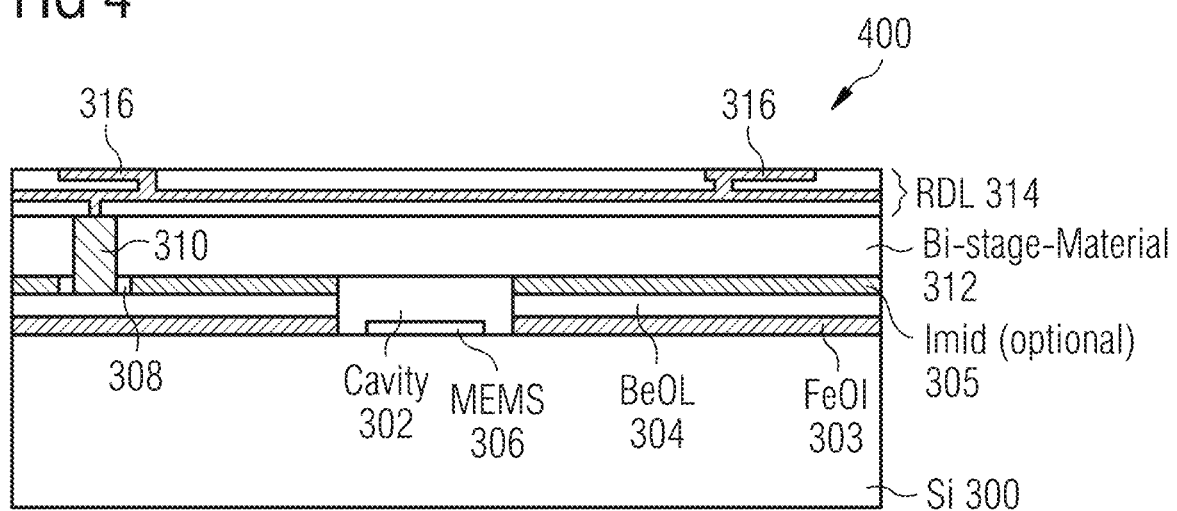
FIG. 4 shows a basic cross-sectional illustration of a packaged MEMS assembly in accordance with one exemplary embodiment.

Before exemplary embodiments of the method for producing packaged MEMS assemblies at the wafer level and the basic construction of a packaged MEMS assembly are explained more specifically below in detail with reference to the figures, it is pointed out that identical, functionally identical or identically acting elements, objects, function blocks and/or method steps are provided with the same reference signs in the various figures, such that the description of said elements, objects, function blocks and/or method steps that is presented in the various exemplary embodiments is mutually interchangeable or can be applied to one another.

Various exemplary embodiments are discussed in detail in the following description, but it is pointed out that the various exemplary embodiments yield many applicable concepts which can be executed or implemented in a multiplicity of MEMS assemblies and the corresponding production methods thereof. The specific exemplary embodiments discussed below merely constitute various specific possibilities for carrying out and using the present concept for producing packaged MEMS assemblies at the wafer level or for applying the latter to packaged MEMS assemblies themselves.

In the context of the following description, reference is made to so-called "MEMS components" (MEMS=microelectromechanical system). MEMS components are deemed to be for example acoustic sound transducers (such as e.g., capacitive or piezoelectric microphones or loudspeakers), accelerometers, gyroscopes, pressure sensors, ultrasonic transducers, etc., in which for example one or more movable parts mechanically coupled to the substrate, such as e.g., membranes, are provided with electrodes for read-out or for drive, wherein the electrodes are applied on the membranes and/or the substrate. In the case of electrostatic MEMS pressure sensors and microphones, the read-out is typically achieved by measuring the capacitance between the electrodes. In the case of transducers acting as actuating devices (actuators), such as e.g., loudspeakers, the device is driven by a potential difference being applied via the electrodes. The above enumeration should not be regarded as exhaustive, however, the present concept being applicable to all microelectromechanical systems.

In accordance with exemplary embodiments, the implementation of a standard RDL process for MEMS applications at the wafer level is made possible by using a layer comprising a so-called b-stage material (such as e.g., a b-stage epoxy, i.e. a partially cured epoxy material) as an interposer system, wherein the b-stage material layer has a multiple functionality to the effect that the b-stage material layer has a dimensional stability that is sufficient to (1) maintain a cavity above the MEMS assemblies during applying on a BeOL stack of a semiconductor wafer with cutouts provided therein for the exposed MEMS assemblies, while (2) vertically (upwardly) projecting through contact elements can furthermore be introduced (pressed) into the still plastically deformable b-stage material layer, such that through contacts can be produced which penetrate through the b-stage material and electrically connect the chip pads (die pads) on the BeOL stack to the RDL structure.

By using the b-stage material, it is thus possible to obtain a process flow in which a cavity is intrinsically formed below the b-stage material, which cavity protects the MEMS assemblies arranged underneath vis à vis ambient influences. This is applicable in particular after the complete curing (crosslinking or polymerizing) of the b-stage material layer.

A basic flow diagram or flowchart of a method 100 for producing packaged MEMS assemblies at the wafer level will now be described below with reference to FIGS. 1-1 and 1-2.

Firstly, then, in FIG. 1-1 in the production method 100, step 110 involves providing a semiconductor substrate 300 with a wiring layer stack 304 having (one or more) cutouts 302 on a first main surface region 300-1 of the semiconductor substrate 300. At the first main surface region 300-1 of the semiconductor substrate 300 one or more MEMS components 306 are arranged "in an exposed manner" in the cutouts 302 of the wiring layer stack 304. Vertically (upwardly) projecting through contact elements 310 are furthermore arranged at metallization regions 308 of the wiring layer stack 304.

The semiconductor substrate 300 can be for example a semiconductor wafer processed in an FeOL process (FeOL=Frontend of Line), such as e.g., an ASIC/MEMS wafer, on which, in a BeOL process, the wiring layer stack 304 (BeOL stack) is applied on the first main surface region 300-1 (having the FeOL structures 303) thereof, wherein the wiring layer stack 304 has cutouts or openings 302 extending in the wiring layer stack 304 as far as the first main surface region 300-1 of the semiconductor substrate 300. The MEMS components 306 arranged in or at the semiconductor substrate 300 are thus exposed through the wiring layer stack 304, or not covered by the latter. The MEMS components 306 are thus arranged in an exposed manner (upwardly) in the regions of the cutouts 302 of the wiring layer stack 304. The through contact elements 310 projecting vertically from the wiring layer stack 304 are then arranged at the correspondingly provided metallization regions 308 of the wiring layer stack 304, wherein, in the context of the present description, the term "vertically projecting" can be regarded as perpendicular to the first main surface region 300-1 of the semiconductor substrate 300.

The wiring layer stack 304 (in step 110 of providing) can furthermore have one or more (optional) spacer layer(s) 305, wherein the optional spacer layer 305 is arranged at the wiring layer stack 304 such that the cutouts 302 in the wiring layer stack 304 and the metallization regions 308 at the wiring layer stack 304 are exposed by the spacer layer 305. In order to obtain a larger distance at a surface region 304-1 of the wiring layer stack 304 with respect to the MEMS structures 306 at the first main surface region 300-1 of the semiconductor substrate 300, i.e. in order to configure the cutouts or openings 302 in the wiring layer stack 304 such that they are higher, the wiring layer stack 304 can thus furthermore have the additional (optional) spacer layer(s) 305. The spacer layer 305 can be obtained for example by applying (laminating) an additional layer comprising an insulation material, such as e.g. an imide layer or oxide layer.

The (processed) semiconductor substrate 300 together with the wiring layer stack 304 is also referred to as functional wafer 301, for example, in the following description.

In step 130, a b-stage material layer 312 (also called "bi"-stage material layer), such as e.g., a partially cross-linked epoxy material layer (=a layer composed of a partially crosslinked epoxy material), is then applied on the wiring layer stack 304, such that the cutouts 302 in the wiring layer stack 304 are covered by the b-stage material layer 312 and the vertically projecting through contact elements 310 are furthermore introduced or pressed into the b-stage material layer 312.

In step 130, therefore, a b-stage material layer (b-stage epoxy layer) is applied or laminated onto the wiring layer stack 304, such that the cutouts or openings 302 in the wiring layer stack 304 are covered or closed by the b-stage material layer 312 in order to form corresponding cavities 302 above the MEMS components 306 arranged at the semiconductor substrate 300, i.e. between the semiconductor substrate 300 and the b-stage material layer 312.

In step 130 of applying, the through contact elements 310 projecting vertically (with respect to the first surface region 300-1 of the semiconductor substrate 300) are furthermore introduced or pressed (in a positively locking manner) into the b-stage material layer 312, such that the vertically extending through contact elements 310 extend into the b-stage material layer 312 (cured in an intermediate stage) in a manner corresponding to their vertical height "h".

The vertically projecting through contact elements 310 can have for example a vertical height "h" of 30 to 80 and approximately 50 μm, and wherein the b-stage material layer 312 has a thickness "d" of between 50 and 120 μm and approximately 80 μm, wherein the thickness "d" is greater than or equal to the height "h", i.e. "d≥h". The through contact elements 310 can be produced as "height structures" for example using so-called "stud bump elements" or using plating techniques (electroplating).

A b-stage material layer 312 cured in an intermediate stage is deemed to be for example a b-stage epoxy material in layer form which is cured (partially polymerized or partially crosslinked) up to an intermediate stage and is still plastically deformable or flexible in order to receive the vertically extending through contact elements 310, but is also sufficiently dimensionally stable in order to form the cavities 302 above the MEMS components 306.

A b-stage material can have for example a plurality of hardening or curing stages which are reached in a targeted manner by means of UV curing and/or thermal curing, which can be carried out successively, for example. However, other curing mechanisms may also be used or required depending on the b-stage epoxy material used.

In the context of the present description of the exemplary embodiments, a b-stage material is for example a polymer material or an epoxy material (b-stage epoxy) having at least two curing stages, e.g. an intermediate curing stage (softbake=partially crosslinked or partially polymerized) and a fully cured stage (hardbake=fully crosslinked or fully polymerized). Two curing mechanisms may often be used, e.g. UV curing (UV=ultraviolet), followed by thermal curing.

In the "intermediate" curing stage (also called interim curing stage) the b-stage material, which is e.g., epoxy-based, is no longer liquid, but rather has a soft, e.g. plastically deformable and flexible but dimensionally stable, state. On account of the plastically deform-able (non-liquid) characteristic of the b-stage material cured in an intermediate stage, this material can be structured like a film, such as e.g., a DAF tape (DAF=die attached film) or an SU8 film. Alternatively, a b-stage material layer cured in an intermediate stage can also be obtained by means of a thick-film spin-coating process on a wafer, whereupon a soft-bake process, i.e. curing to an intermediate curing state, can ensue. In the intermediate curing state, the b stage material is still adhesive and can also be used as adhesive material.

In accordance with present exemplary embodiments, therefore, the step of applying (laminating) 130 involves using a b-stage material that is cured to the intermediate curing stage, wherein the cutouts 302 are closed by the b-stage material layer 312 and the vertically projecting through contact elements (interconnection bumps) can furthermore be pressed into the b-stage material layer. Applying, as is also explained below for various exemplary embodiments, can be carried out during a laminating process or a wafer transfer (wafer bonding).

"Curing the b-stage material to different stages" (also called b-staging) thus denotes for example a process that uses heat and/or UV light in order (in accordance with the desired curing) to remove a portion of the solvent from the b-stage material, e.g. an adhesive material or epoxy material, as a result of which the different (i.e. at least two) curing stages of the b-stage material can be obtained.

In the step of applying 130, the b-stage material cured to an intermediate stage or interim stage (b-stage), e.g. a partially crosslinked epoxy material, can be applied or laminated onto the wiring layer stack, wherein the applied b-stage material is cured to such a curing stage in order to have a sufficient layer stability, such that the cavities above the MEMS components in the cutouts of the wiring layer stack are formed or maintained during the process of applying the b-stage material.

In the step of applying 130, the b-stage material 312 produces for example a cohesive connection to the (first) surface region 304-1 of the wiring layer stack 304, wherein a positively locking connection of the b-stage material layer 312 to the vertically projecting through contact elements 310 introduced into the b-stage material is furthermore produced.

In step 150, the b-stage material cured in an intermediate stage (the b-stage material layer 312 cured in an intermediate stage) is cured in order to obtain a cured (or fully cured) b-stage material layer 312, e.g. a fully crosslinked or fully polymerized epoxy material layer. In step 150 of curing, the b-stage material layer 312 cured in an intermediate stage is brought to a final curing stage (final stage). During the process of (completely) curing 150 the b-stage material layer to the final curing state, a mechanically stable layer composed of the fully cured b-stage material 312 is obtained on the functional wafer 301. By curing the b-stage material 312, it is possible to produce a cohesive connection of the b-stage material 312 to the wiring layer stack 304 at the surface region 304-1. As a result of the curing of the b-stage material 312, said material undergoes transition to a "grindable" state.

In a step 170 of thinning of the cured b-stage material layer, the cured b-stage material layer is removed or ground away layerwise (e.g., by means of grinding or CMP=Chemically Mechanically Polishing) in order to expose end surface regions 310-1 of the through contact elements 310 as accessible contact pads.

The cured b-stage material 312 is thus removed (thinned or eroded) layerwise by means of grinding, for example, in order to obtain end surface regions 310-1 (contact pads) of the through contact elements 310, said end surface regions being arranged parallel to the first main surface region 300-1 of the semiconductor substrate 300, at the resulting, processed surface region 312-1 of the thinned, cured b-stage material layer 312. Consequently, the through contact elements 310 projecting vertically from the wiring layer stack 304 then extend from the wiring layer stack 304 through the cured b-stage material layer 312 as far as the exposed end surface regions 310-1 at the processed main surface region 312-1 of the cured and thinned b-stage material layer 312.

In step 190, an RDL structure 314 (RDL=redistribution layer) is then applied to the thinned, cured b-stage material layer 312 in order to obtain an electrical connection between the contacting pads (contact pads) 308 at the wiring layer stack 304 and the RDL structure 314 via the through contact elements 310 extending through the cured b-stage material layer 312.

The RDL structure 314 is thus applied on the resulting surface region 312-1 of the thinned and cured b-stage material layer 312 in order to produce electrical connections between the wiring layer stack 304 and (outwardly) exposed contact regions 316 of the RDL structure 312 via the through contact elements 310.

In accordance with the exemplary embodiment described, it is thus possible to apply a standard RDL process 190 over the entire functional wafer 301 in order to finalize the functional wafer 301 (MEMS wafer).

The following process steps (standard RDL process), for example, can be used as standard for producing the RDL structure. In this regard, firstly a dielectric (e.g., imide) can be applied as coating directly at the top side 304-1 of the BeOL stack 304, wherein this applying or coating of the BeOL stack 304 is carried out over the entire functional wafer 301. Next, the dielectric is patterned lithographically. Afterward, e.g. a copper material is plated in order to produce through contacts (vias). Afterward, a metal layer is applied, wherein this applying or this deposition is carried out over the entire functional wafer 301. The metal layer is thereupon patterned, wherein the previous steps can be repeated in order to obtain a plurality of RDL layer planes. Finally, the final layer structure will be suitable with solder pads or pads for applying solder bumps, solder and/or wire connections (wire bonding).

Packaged MEMS assemblies 320 comprising the RDL structure 314 are thus obtained at the wafer level.

After step 190 of applying an RDL structure, in an optional step 195, solder bumps 322 can furthermore (optionally) be attached to (outwardly exposed) metallization regions 316 of the RDL structure 314 in order to obtain the packaged MEMS assemblies 324 provided with solder bumps at the wafer level. Finally, the packaged MEMS assemblies 324 can be singulated in order to obtain singulated, packaged MEMS assemblies (e.g., flip-chip MEMS assemblies) 326. In the optional step 195, if necessary, a standard bumping process can be performed in order to produce MEMS flip-chip assemblies, for example, which comprise solder bumps 322 at the metallization regions 316 of the RDL structure 314.

In an optional step 200, the MEMS assemblies 324 packaged at the wafer level can be singulated, for example, in order to obtain singulated, packaged MEMS assemblies (flip-chip MEMS assemblies) 326 (also cf. the MEMS assembly 400 in FIG. 4). The process sequence 100 illustrated with reference to FIGS. 1-1 and 1-2 can be used, for example, to realize an eWLB package using TSPs (Through Silicon Plugs) and Wire on Bump.

With regard to the optional method steps 195 and 200 explained above, it is pointed out that other method steps can also be used for finishing the singulated MEMS assemblies.

The present production method for producing packaged MEMS assemblies at the wafer level makes it possible, then, even if sensitive MEMS structures, such as e.g. membranes of a pressure sensor or a sound transducer, are arranged in an exposed manner on the main surface region of the semiconductor substrate, that RDL standard processes can be applied since the sensitive MEMS structures are protected by the cured b-stage material layer 314 and the through contact elements furthermore penetrate through the cured b-stage material layer as far as the RDL structure and provide an electrical connection between the BeOL stack 304 and the RDL structure 314.

On account of applying and curing the b-stage material on the functional wafer with cavities being formed for the MEMS components, it is possible to apply a standard RDL process in which the entire wafer surface of the functional wafer is processed in order to apply the RDL structure over the whole area. In accordance with the exemplary embodiments, it is thus possible to prevent the MEMS structures from being damaged by the RDL production process and the process of applying the additional RDL layers or from being adversely affected by the use of chemicals. Sensitive MEMS applications can thus be made accessible for RDL technologies. This applies to pressure sensors, for example, in which the use of RDL processes are required.

A basic flow diagram or flowchart of a method 100A for producing packaged MEMS assemblies at the wafer level in accordance with a further exemplary embodiment will now be described below with reference to FIGS. 2-1, 2-2 and 2-3.

Firstly, it is pointed out that only the changed, adapted or supplemented elements and/or method steps are described in detail below on the basis of the exemplary process sequence 100A in FIGS. 2-1, 2-2 and 2-3, the rest of the elements and/or method steps corresponding to those of the production method 100 in FIGS. 1-1 and 1-2 and only being described again briefly, since the description of these elements and/or method steps that is presented in the various exemplary embodiments is mutually interchangeable or can be applied to one another.

In the exemplary process sequence 100A in FIGS. 2-1, 2-2 and 2-3, the production steps 130 of applying a b-stage material layer cured in an intermediate curing stage and of thinning 170 the cured b-stage material layer are adapted by comparison with the exemplary process sequence 100 in FIGS. 1-1 and 1-2.

Firstly, then, in FIG. 2-1 in the production method 100A, step 110 involves providing a semiconductor substrate 300 with a wiring layer stack 304 having (one or more) cutouts 302 on a first main surface region 300-1 of the semiconductor substrate 300. At the first main surface region 300-1 of the semiconductor substrate 300 one or more MEMS components 306 are arranged "in an exposed manner" in the cutouts 302 of the wiring layer stack 304. Vertically (upwardly) projecting through contact elements 310 are furthermore arranged at metallization regions 308 of the wiring layer stack 304. Furthermore, in step 110, the b-stage material 312 cured to an intermediate stage and arranged at a transfer wafer 330 (transfer substrate, e.g. a silicon wafer) can be provided.

In step 130, a b-stage material layer 312 (also called "bi"-stage material layer), such as e.g., a partially cross-linked epoxy material layer (=a layer composed of a partially crosslinked epoxy material), is then applied on the wiring layer stack 304, such that the cutouts 302 in the wiring layer stack 304 are covered by the b-stage material layer 312 and the vertically projecting through contact elements 310 are furthermore introduced or pressed into the b-stage material layer 312.

In the further procedure for step 130 of applying in accordance with the production method 100A, the b-stage material 312 having a thickness of approximately 80 μm or between 50 and 110 μm, such as e.g. SU8 or imide, is arranged at the transfer wafer 330, wherein the step of applying 130 involves applying the transfer wafer 330 with the b-stage material layer 312 on the functional wafer 301, i.e. the semiconductor substrate 300 with the wiring layer stack 304, such that the b-stage material layer covers the cutouts 302 in the wiring layer stack 304 and the vertically projecting through contacts 310 of the wiring layer stack 304 are introduced or pressed (in a positively locking manner) into the b-stage material layer 312 cured in an intermediate stage.

Step 130 of applying the b-stage material layer 312 cured in an intermediate stage on the wiring layer stack 304 can thus be carried out, for example, by the functional wafer 301 and the transfer wafer 330 with the b stage material layer 312 being bonded to one another (wafer-to-wafer bonding).

In step 150, the b-stage material 312 is then cured to its final curing state, wherein the risk of the b-stage material 312 being pressed into the cavities 302 can be minimized owing to the presence of the transfer wafer 330 and wafer bow of the functional wafer 301 can furthermore be reduced owing to the additional stability as a result of the transfer wafer 330.

Turning to FIG. 2-2, in a step 170 of thinning of the cured b-stage material layer 312, the cured b-stage material layer 312 is removed or ground away layerwise (e.g., by means of grinding or CMP=Chemically Mechanically Polishing) in order to expose the end surface regions 310-1 of the through contact elements 310 as accessible contact pads. After curing the b-stage material 312, e.g., the polymer layer, it is thus possible for the cured b-stage material layer 312 to be ground until the end surface regions 310-1 of the through contact elements 310 are again exposed or open as contact pads.

Afterward, in step 190, as shown in FIG. 1-2, the RDL structure can be applied by means of a standard RDL process in order to finalize the functional wafer, i.e. in order to obtain the packaged MEMS assemblies at the wafer level.

To summarize, it can thus be stated that, in accordance with the production method 100A, the cured b-stage material layer 312 can be arranged at a transfer wafer 330, wherein then in the step of curing 150 the b-stage material layer 312 situated at the transfer wafer 330 is cured, and wherein then in the step 170 of thinning firstly the transfer wafer 330 is removed or ground away and afterward the cured b-stage material layer 312 is thinned (ground away) in order to expose the end surface regions 310-1 of the through contact elements 310 projecting vertically from the wiring layer stack 304 as contact pads.

After step 190 of applying an RDL structure, optional solder bumps (not shown in FIGS. 2-1, 2-2 and 2-3) can furthermore be attached to (outwardly exposed) metallization regions of the RDL structure in order to obtain the packaged MEMS assemblies provided with solder bumps at the wafer level. Furthermore, the MEMS assemblies packaged at the wafer level can be singulated, for example, in order to obtain singulated, packaged MEMS assemblies (flip-chip MEMS assemblies) (also cf. the MEMS assembly 400 in FIG. 4). Thus, steps 195 and 200 illustrated with reference to FIG. 1-2 can also be carried out in the production method 100A as shown in FIG. 2-3.

A further basic flow diagram or flowchart of a method 100B for producing packaged MEMS assemblies at the wafer level in accordance with a further exemplary embodiment will now be described below with reference to FIGS. 3-1, 3-2 and 3-3.

Firstly, it is pointed out that only the changed, adapted or supplemented elements and/or method steps are described in detail below on the basis of the exemplary process sequence 100B in FIGS. 3-1, 3-2 and 3-3, the rest of the elements and/or method steps corresponding to those of the production methods 100, 100A in FIGS. 1-1, 1-2, 2-1, 2-2 and 2-3 and only being described again briefly, since the description of these elements and/or method steps that is presented in the various exemplary embodiments is mutually interchangeable or can be applied to one another.

Firstly, then, in FIG. 3-1 in the production method 100B, step 110 involves providing a semiconductor substrate 300 with a wiring layer stack 304 having (one or more) cutouts 302 on a first main surface region 300-1 of the semiconductor substrate 300. At the first main surface region 300-1 of the semiconductor substrate 300 one or more MEMS components 306 are arranged "in an exposed manner" in the cutouts 302 of the wiring layer stack 304. Vertically (upwardly) projecting through contact elements 310 are furthermore arranged at metallization regions 308 of the wiring layer stack 304. Furthermore, in step 110, the b-stage material 312 cured to an intermediate stage and arranged at a transfer wafer 330 (transfer substrate, e.g. a silicon wafer) can be provided.

In step 130, a b-stage material layer 312 (also called "bi"-stage material layer), such as e.g., a partially crosslinked epoxy material layer (=a layer composed of a partially crosslinked epoxy material), is then applied on the wiring layer stack 304, such that the cutouts 302 in the wiring layer stack 304 are covered by the b-stage material layer 312 and the vertically projecting through contact elements 310 are furthermore introduced or pressed into the b-stage material layer 312.

The b-stage material 312 is then cured to its final curing state in step 150. In the process sequence 100B, after step 150 of curing the b-stage material layer situated at the transfer wafer, i.e. after packaged MEMS assemblies have been obtained at the wafer level, and furthermore before step 170 of thinning, the following steps 155 and 160 can be performed.

In this regard, in step 155 shown in FIG. 3-2, the packaged MEMS assemblies (after the step of curing the b-stage material layer 312) can be singulated in order to obtain singulated, packaged MEMS intermediate elements 340.

In step 160, the singulated MEMS intermediate elements 340 can be arranged on a further carrier substrate 342, wherein the packaged MEMS intermediate elements 340 arranged on the carrier substrate are potted with a potting compound 344 in order to fix the singulated MEMS intermediate elements 340 to the carrier substrate 342. The arrangement of the singulated MEMS intermediate elements 340 fixed to the carrier substrate 342 with the potting compound 344 can be referred to for example as a recon wafer (reconfiguration wafer) 350.

Afterward, in step 170 shown in FIG. 3-3, the recon wafer 350 (proceeding from the surface region 350-1) can be thinned or ground (grinding) in order to remove the carrier wafer sections 330, the potting compound 344 and the cured b-stage material 312 until the end surface regions 310-1 of the (vertically projecting) through contact elements 310 are exposed as contact pads.

Finally, once again in step 190 the RDL structure is applied on the thinned, cured b-stage material layer 312, i.e. for example on the packaged MEMS assemblies 340 fixed to the carrier substrate 342, in order to obtain MEMS assemblies packaged at the wafer level. Finally, it is thus again possible to apply standard RDL processes in order to finalize the eWLB wafer. Furthermore, the carrier substrate 342 can be removed again.

After singulating the packaged MEMS assemblies, singulated, packaged MEMS assemblies 326 (e.g., flip-chip MEMS assemblies) can be obtained, wherein for example lateral regions of the package can still be provided with the potting compound 344. The MEMS assemblies 340 fixed to the carrier substrate can once again be singulated in order to obtain singulated MEMS assemblies 326 (optional step 200).

The "adapted" process steps of the production method 100B can be carried out in order to reduce the risk of wafer bow of the functional wafer after step 170 of thinning (grinding away), wherein alternatively the wafer composite 350 comprising the functional wafer 340 with the transfer wafer 330 bonded thereto can be singulated (diced). With the singulated intermediate assemblies it is possible to construct a so-called "eWLB Recon Wafer" 350 (Recon=reconfiguration).

Exemplary embodiments of the production method show a process sequence (cf. FIGS. 2-1, 2-2, 2-3, 3-1, 3-2 and 3-3) in which for example a so-called "transfer wafer" is used in order to introduce or press through contact elements (interconnections) into a b-stage material, wherein this process can also be referred to as "wafer-on-bump" technology.

FIG. 4 then illustrates a basic illustration (as a sectional view) of a singulated, packaged MEMS assembly 400.

The packaged MEMS assembly 400 comprises a semiconductor substrate 300 with a wiring layer stack 304 having a (at least one) cutout 302 on a first main surface region 300-1 having the FeOL structures 303 of the semiconductor substrate 300, wherein at the first main surface region 300-1 of the semiconductor substrate 300 a MEMS component 306 is arranged in an exposed manner in the cutout 302 of the wiring layer stack 304, and wherein vertically projecting through contact elements 310 are arranged at metallization regions 308 of the wiring layer stack 304. The packaged MEMS assembly 400 further comprises a cured b-stage material layer 312, e.g. a fully crosslinked epoxy material layer, on the wiring layer stack 304, wherein the cutout 302 in the wiring layer stack 304 is closed by the cured b-stage material layer 312 and the vertically projecting through contact elements 310 are furthermore introduced in the cured b-stage material layer 312 and extend through the cured b-stage material layer 312. The packaged MEMS assembly 400 furthermore comprises an RDL structure 314 (RDL=Redistribution Layer) on the main surface region 300-1 of the cured b-stage material layer 312, wherein end surface regions 310-1 of the vertically extending through contact elements 310 are connected (electrically and mechanically) to the RDL structure 314 at a main surface region 312-1 of the cured b-stage material layer 312 in order to provide an electrical connection between the wiring layer stack 304 and the RDL structure 314.

The wiring layer stack 304 can furthermore have an additional spacer layer 305, wherein the cutouts 302 in the wiring layer stack 304 and the metallization regions 308 of the wiring layer stack 304 are exposed by the additional spacer layer 305.

The cured b-stage material layer 312 can have a cohesive connection to the first surface region of the wiring layer stack 304, wherein the cured b-stage material layer 312 can furthermore have a positively locking connection to the vertically extending through contact elements 310.

Furthermore, solder bumps (not shown in FIG. 4) can be provided at the outer exposed metallization regions 316 of the RDL structure 314 in order to form a packaged flip-chip MEMS assembly.

The semiconductor substrate 300 is for example a semiconductor wafer processed in an FeOL process (FeOL=Frontend of Line), such as e.g. an ASIC/MEMS wafer, on which, the wiring layer stack 304 (BeOL stack) is applied on the first main surface region 300-1 (having the FeOL structures 303), wherein the wiring layer stack 304 has cutouts or openings 302 extending in the wiring layer stack 304 as far as the first main surface region 300-1 of the semiconductor substrate 300. The MEMS components 306 arranged in or at the semiconductor substrate 300 are thus exposed through the wiring layer stack 304, or not covered by the latter. The MEMS components 306 are thus arranged in an exposed manner (upwardly) in the regions of the cutouts 302 of the wiring layer stack 304. The through contact elements 310 projecting vertically from the wiring layer stack 304 are then arranged at the correspondingly provided metallization regions 308 of the wiring layer stack 304, wherein, in the context of the present description, the term "vertically projecting" can be regarded as perpendicular to the first main surface region 300-1 of the semiconductor substrate 300.

The wiring layer stack 304 can furthermore have one or more (optional) spacer layer(s) 305, wherein the optional spacer layer 305 is arranged at the wiring layer stack 304 such that the cutouts 302 in the wiring layer stack 304 and the metallization regions 308 at the wiring layer stack 304 are exposed by the spacer layer 305. In order to obtain a larger distance at a surface region 304-1 of the wiring layer stack 304 with respect to the MEMS structures 306 at the first main surface region 300-1 of the semiconductor substrate 300, i.e. in order to configure the cutouts or openings 302 in the wiring layer stack 304 such that they are higher, the wiring layer stack 304 can thus furthermore have the additional (optional) spacer layer(s) 305. The spacer layer 305 can be obtained for example by applying (laminating) an additional layer comprising an insulation material, such as e.g. an imide layer or oxide layer.

The vertically projecting through contact elements 310 can have for example a vertical height "h" of 30 to 80 and approximately 50 µm, and wherein the b-stage material layer 312 has a thickness "d" of between 50 and 120 µm and approximately 80 µm, wherein the thickness "d" is greater than or equal to the height "h", i.e. "d≥h". The through contact elements 310 can be produced as "height structures" for example using so-called "stud bump elements" or using plating techniques (electroplating).

The RDL structure 314 (RDL=redistribution layer) is applied on the cured b-stage material layer 312 in order to obtain an electrical connection between the contacting pads (contact pads) 308 at the wiring layer stack 304 and the RDL structure 314 via the through contact elements 310 extending through the cured b-stage material layer 312.

In accordance with a first aspect, a production method 100; 100A; 100B can comprise the following steps: providing no a semiconductor substrate 300 with a wiring layer stack 304 having cutouts 302 on a first main surface region 300-1 of the semiconductor substrate 300, wherein at the first main surface region 300-1 of the semiconductor substrate 300 MEMS components 306 are arranged in an exposed manner in the cutouts 302 of the wiring layer stack 304, and wherein projecting through contact elements 310 are arranged at metallization regions 308 of the wiring layer stack 304, applying 130 a b-stage material layer 312 cured in an intermediate stage on the wiring layer stack 304, such that the cutouts 302 in the wiring layer stack 304 are covered by the b-stage material layer 312 and the vertically projecting through contact elements 310 are furthermore introduced into the b-stage material layer 312, curing 150 the b-stage material layer 312 in order to obtain a cured b-stage material layer 312, thinning 170 the cured b-stage material layer 312 in order to expose end surface regions 310-1 of the through contact elements 310, and applying 190 an RDL structure (RDL=Redistribution Layer) on the thinned, cured b-stage material layer 312 in order to obtain an electrical connection between the wiring layer stack 304 and the RDL structure 314 via the through contact elements 310.

In accordance with a second aspect referring to the first aspect, the step of applying the b-stage material layer can involve producing a cohesive connection to the first surface region of the wiring layer stack, and furthermore producing a positively locking connection of the b-stage material layer to the vertically projecting through contact elements.

In accordance with a third aspect referring to the first aspect, the method can furthermore comprise the following step: after the step of applying an RDL structure, applying 195 solder bumps at metallization regions of the RDL structure.

In accordance with a fourth aspect referring to the third aspect, the method can furthermore comprise the following step: singulating 200 the packaged MEMS assemblies in order to obtain singulated, packaged MEMS assemblies or flip-chip MEMS assemblies.

In accordance with a fifth aspect referring to the first aspect, in the production method the wiring layer stack in the step of providing can furthermore have a spacer layer, wherein the spacer layer is arranged at the wiring layer stack such that the cutouts in the wiring layer stack and the metallization regions in the wiring layer stack are exposed by the spacer layer.

In accordance with a sixth aspect referring to the first aspect, in the production method, the through contact elements can have a vertical height "h" of 30 to 80 and approximately 50 μm, and the b-stage material layer 312 can have a thickness "d" of between 50 and 120 μm and approximately 80 μm, where "d≥h".

In accordance with a seventh aspect referring to the first aspect, in the production method, the b-stage material layer cured with an intermediate stage can comprise a partially cross-linked epoxy material, and the cured b-stage material layer can comprise a fully crosslinked epoxy material.

In accordance with an eighth aspect referring to the first aspect, in the production method, the b-stage material layer applied in the step of applying can have a dimensional stability, such that cavities above the MEMS components in the cutouts of the wiring layer stack are maintained during the process of applying the b-stage material layer 312.

In accordance with a ninth aspect referring to the first aspect, in the production method 100A; 100B, the b-stage material layer cured with an intermediate stage can be arranged at a transfer wafer, wherein, in the step of applying the b-stage material layer cured with an intermediate stage, the transfer wafer with the b-stage material layer cured with an intermediate stage can be applied on the semiconductor substrate with the wiring layer stack such that the b-stage material layer cured with an intermediate stage covers the cutouts in the wiring layer stack and the vertically projecting through contacts at the wiring layer stack are introduced into the b-stage material layer cured with an intermediate stage.

In accordance with a tenth aspect referring to the first aspect, in the step of curing, the b-stage material layer cured with an intermediate stage and situated at the transfer wafer can be completely cured, and, in the step of thinning, firstly the transfer wafer can be removed and then the cured b-stage material layer can be thinned in order to expose the end surface regions of the vertically projecting through contact elements.

In accordance with an eleventh aspect referring to the ninth aspect, in the step of curing, the b-stage material layer cured with an intermediate stage and situated at the transfer wafer can be cured, and packaged MEMS assemblies can be obtained at the wafer level, wherein the production method 100B can furthermore comprise the following step: singulating 155 the packaged MEMS assemblies in order to obtain singulated, packaged MEMS intermediate elements, and arranging 160 the singulated, packaged MEMS intermediate elements on a further carrier substrate and potting the packaged MEMS intermediate elements with a potting compound in order to fix the singulated MEMS intermediate elements to the carrier substrate, and thinning 170 the packaged MEMS intermediate elements fixed to the further carrier substrate in order to remove the potting compound, the carrier substrate 330 and the cured b-stage material layer at least as far as the end surface regions of the through contact elements in order to expose the end surface regions of the vertically projecting through contact elements, and applying 190 the RDL structure on the packaged MEMS intermediate elements fixed to the carrier substrate.

In accordance with a twelfth aspect referring to the eleventh aspect, the production method can furthermore comprise the following step: singulating the thinned MEMS intermediate elements fixed to the carrier substrate in order to obtain singulated MEMS assemblies.

In accordance with a thirteenth aspect, a packaged MEMS assembly 400 can comprise the following features: a semiconductor substrate 300 with a wiring layer stack 304 having a cutout 302 on a first main surface region 300-1 of the semiconductor substrate 300, wherein at the first main surface region 300-1 of the semiconductor substrate 300 a MEMS component 306 is arranged in an exposed manner in the cutout 302 of the wiring layer stack 304, and wherein vertically projecting through contact elements 310 are arranged at metallization regions 308 of the wiring layer stack 304, a cured b-stage material layer 312 on the wiring layer stack 304, wherein the cutout 302 in the wiring layer stack is closed by the cured b-stage material layer 312 and the vertically projecting through contact elements are furthermore introduced in the cured b-stage material layer 312 and extend through the cured b-stage material layer 312, and an RDL structure (RDL=Redistribution Layer) on the main surface region of the cured b-stage material layer 312, wherein end surface regions 310-1 of the vertically extending through contact elements 310 are connected to the RDL structure 314 at a main surface region 312-1 of the cured b-stage material layer 312 in order to provide an electrical connection between the wiring layer stack 304 and the RDL structure 314.

In accordance with a fourteenth aspect referring to the thirteenth aspect, in the case of the packaged MEMS assembly 400, the wiring layer stack 304 can furthermore have an additional spacer layer 305, wherein the cutouts 302 in the wiring layer stack 304 and the metallization regions 308 of the wiring layer stack 304 can be exposed by the additional spacer layer 305.

In accordance with a fifteenth aspect referring to the thirteenth aspect, in the case of the packaged MEMS assembly 400, the through contact elements can have a vertical height "h" of 30 to 80 and approximately 50 μm, and the b-stage material layer 312 can have a thickness "d" of between 50 and 120 μm and approximately 80 μm, where "d≥h".

In accordance with a sixteenth aspect referring to the thirteenth aspect, in the case of the packaged MEMS assembly 400, the cured b-stage material layer 312 can have a cohesive connection to the first surface region of the wiring layer stack, and the cured b-stage material layer 312 can furthermore have a positively locking connection to the vertically extending through contact elements.

In accordance with a seventeenth aspect referring to the thirteenth aspect, in the case of the packaged MEMS assembly 400, solder bumps can be provided at the outer exposed metallization regions of the RDL structure in order to form a packaged flip-chip MEMS assembly.

Although some aspects have been described in association with a device, it goes without saying that said aspects also constitute a description of the corresponding method, such that a block or a component of a device should also be understood as a corresponding method step or as a feature of a method step. Analogously thereto, aspects that have been described in association with or as a method step also constitute a description of a corresponding block or detail or feature of a corresponding device.

The exemplary embodiments described above merely constitute an illustration of the principles of the present invention. It goes without saying that modifications and variations of the arrangements and details described herein will become apparent to others skilled in the art. Therefore, the intention is for the invention to be restricted only by the scope of protection of the following patent claims and not by the specific details that have been presented on the basis of the description and the explanation of the exemplary embodiments herein.

What is claimed is:

1. A packaged MEMS assembly, comprising:
a semiconductor substrate with a wiring layer stack having a cutout on a first main surface region of the semiconductor substrate, wherein at the first main surface region of the semiconductor substrate a MEMS component is arranged in an exposed manner in the cutout of the wiring layer stack, and wherein vertically projecting through contact elements are arranged at metallization regions of the wiring layer stack,
a cured b-stage material layer on the wiring layer stack, wherein the cutout in the wiring layer stack is closed by the cured b-stage material layer and the vertically projecting through contact elements are furthermore introduced in the cured b-stage material layer and extend through the cured b-stage material layer, an upper surface of the cured b-stage material layer being co-planar with an upper surface of the contact elements, and
a redistribution layer (RDL) structure on a main surface region of the cured b-stage material layer, wherein end surface regions of the vertically extending through contact elements are connected to the RDL structure at the main surface region of the cured b-stage material layer in order to provide an electrical connection between the wiring layer stack and the RDL structure.

2. The packaged MEMS assembly as claimed in claim 1, wherein the wiring layer stack furthermore has an additional spacer layer, wherein the cutout of the wiring layer stack and the metallization regions of the wiring layer stack are exposed by the additional spacer layer.

3. The packaged MEMS assembly as claimed in claim 1, wherein the vertically projecting through contact elements have a vertical height "h" of between 30 µm to and 80 µm, and wherein the cured b-stage material layer has a thickness "d" of between 50 µm and 120 µm, where "d≥h".

4. The packaged MEMS assembly as claimed in claim 1, wherein the cured b-stage material layer has a cohesive connection to a first surface region of the wiring layer stack, and the cured b-stage material layer furthermore has a positively locking connection to the vertically extending through contact elements.

5. The packaged MEMS assembly as claimed in claim 1, wherein solder bumps are provided at outer exposed metallization regions of the RDL structure in order to form a packaged flip-chip MEMS assembly.

6. The packaged MEMS assembly as claimed in claim 1, wherein the cured b-stage material layer comprises an epoxy material.

7. A packaged MEMS assembly, comprising:
a semiconductor substrate;
a wiring layer stack disposed on a first main surface region of the semiconductor substrate, the wiring layer stack defining a cavity bounded by the first main surface region of the semiconductor substrate;
a MEMS component disposed on the first main surface region of the semiconductor substrate in the cavity of the wiring layer stack;
a cured b-stage material layer disposed on the wiring layer stack and enclosing the cavity defined by the wiring layer stack; and
contact elements arranged at metallization regions of the wiring layer stack and extending through the cured b-stage material layer,
wherein an upper surface of the cured b-stage material layer is co-planar with an upper surface of the contact elements.

8. The packaged MEMS assembly as claimed in claim 7, further comprising a redistribution layer (RDL) structure disposed on a main surface region of the cured b-stage material layer, wherein end surface regions of the contact elements are electrically connected to the RDL structure at the main surface region of the cured b-stage material layer.

9. The packaged MEMS assembly as claimed in claim 8, further comprising solder bumps disposed on outer exposed metallization regions of the RDL structure.

10. The packaged MEMS assembly as claimed in claim 7, wherein the wiring layer stack comprises a spacer layer, wherein the spacer layer exposes the cavity and metallization regions of the wiring layer stack.

11. The packaged MEMS assembly as claimed in claim 7, wherein the cured b-stage material layer comprises:
a cohesive connection to a first surface region of the wiring layer stack; and
a positively locking connection to the contact elements.

12. The packaged MEMS assembly as claimed in claim 7, wherein the contact elements have a vertical height "h" of between 30 µm to and 80 µm, and wherein the cured b-stage material layer has a thickness "d" of between 50 µm and 120 µm, where "d h".

13. The packaged MEMS assembly as claimed in claim 7, wherein the vertical height "h" is 50 µm and the thickness "d" is 80 µm.

14. The packaged MEMS assembly as claimed in claim 7, wherein the MEMS component is a microphone.

15. A method of forming a packaged MEMS assembly, the method comprising:
forming a wiring layer stack on a first main surface region of a semiconductor substrate, the wiring layer stack defining a cavity bounded by the first main surface region of the semiconductor substrate;
forming a MEMS component on the first main surface region of the semiconductor substrate in the cavity of the wiring layer stack;
forming a cured b-stage material layer on the wiring layer stack having a planar upper surface and enclosing the cavity defined by the wiring layer stack; and
forming contact elements arranged at metallization regions of the wiring layer stack and extending through the cured b-stage material layer, the contact elements having a planar upper surface co-planar with the planar upper surface of the cured b-stage material layer.

16. The method of claim 15, further comprising forming a redistribution layer (RDL) structure on a main surface region of the cured b-stage material layer.

17. The method of claim 15, further comprising electrically connecting end surface regions of the contact elements to the RDL structure at the main surface region of the cured b-stage material layer.

18. The method of claim 17, further comprising forming solder bumps on outer exposed metallization regions of the RDL structure.

19. The method of claim 15, wherein forming the wiring layer stack comprises forming a spacer layer of the wiring layer stack, wherein the spacer layer exposes the cavity and metallization regions of the wiring layer stack.

20. The method of claim 15, wherein the contact elements have a vertical height "h" of between 30 μm to and 80 μm, and wherein the cured b-stage material layer has a thickness "d" of between 50 μm and 120 μm, where "d≥h".

* * * * *

UNITED STATES PATENT AND TRADEMARK OFFICE
CERTIFICATE OF CORRECTION

PATENT NO. : 10,793,429 B2
APPLICATION NO. : 16/748087
DATED : October 6, 2020
INVENTOR(S) : Matthias Steiert et al.

Page 1 of 1

It is certified that error appears in the above-identified patent and that said Letters Patent is hereby corrected as shown below:

In the Claims

In Column 15, Line 50, Claim 3, delete "between 30 μm to and 80 μm" and insert --between 30 μm and 80 μm--.

In Column 16, Line 39, Claim 12, delete "between 30 μm to and 80 μm" and insert --between 30 μm and 80 μm--.

In Column 16, Line 41, Claim 12, delete "d h" and insert --d ≥ h--.

In Column 17, Line 13, Claim 20, delete "between 30 μm to and 80 μm" and insert --between 30 μm and 80 μm--.

Signed and Sealed this
Fifteenth Day of December, 2020

Andrei Iancu
*Director of the United States Patent and Trademark Office*